United States Patent
Kokish et al.

(10) Patent No.: US 12,002,597 B2
(45) Date of Patent: Jun. 4, 2024

(54) LOW TEMPERATURE LOW-ABUNDANCE ATOMIC OBJECT DISPENSER

(71) Applicant: Quantinuum LLC, Broomfield, CO (US)

(72) Inventors: Mark Kokish, Minneapolis, MN (US); Nathaniel Burdick, Broomfield, CO (US)

(73) Assignee: Quantinuum LLC, Broomfield, CO (US)

( * ) Notice: Subject to any disclaimer, the term of this patent is extended or adjusted under 35 U.S.C. 154(b) by 387 days.

(21) Appl. No.: 17/444,220

(22) Filed: Aug. 2, 2021

(65) Prior Publication Data

US 2022/0062938 A1    Mar. 3, 2022

Related U.S. Application Data

(60) Provisional application No. 63/072,366, filed on Aug. 31, 2020.

(51) Int. Cl.
   *G21G 4/04*     (2006.01)
   *B82Y 10/00*    (2011.01)
   (Continued)

(52) U.S. Cl.
   CPC ............... *G21G 4/04* (2013.01); *B82Y 10/00* (2013.01); *G21K 1/00* (2013.01); *H05H 3/02* (2013.01);
   (Continued)

(58) Field of Classification Search
   None
   See application file for complete search history.

(56) References Cited

U.S. PATENT DOCUMENTS

| 2,154,131 A | 4/1939 | Lederer |
| 3,096,211 A | 7/1963 | Davis |

(Continued)

FOREIGN PATENT DOCUMENTS

| CN | 107389630 A | 11/2017 |
| CN | 108411253 A | 8/2018 |

(Continued)

OTHER PUBLICATIONS

Communication about intention to grant a European patent received for European Application No. 21192673.8, dated Dec. 14, 2022, 6 pages.

(Continued)

*Primary Examiner* — Eliza W Osenbaugh-Stewart
(74) *Attorney, Agent, or Firm* — Alston & Bird LLP

(57) ABSTRACT

Methods and dispensers for dispensing atomic objects are provided. An example method for dispensing atomic objects includes sealing a reaction component at least partially coated with a composition comprising the atomic objects inside an oven; and, with the oven disposed within a pressure-controlled chamber, heating the composition to an atomizing reaction temperature to cause an atomizing chemical reaction to occur. The reaction component comprises a material that is a participant in the reaction. A result of the reaction is elemental atomic objects deposited on a depositing surface within the oven. The atomizing reaction temperature is greater than a dispensing threshold temperature. The method further comprises allowing the oven to cool below the dispensing threshold temperature; and heating the oven to a dispensing temperature to cause the elemental atomic objects to be dispensed from the oven through a dispensing aperture. The dispensing temperature does not exceed the dispensing threshold temperature.

20 Claims, 7 Drawing Sheets

Figure 1:
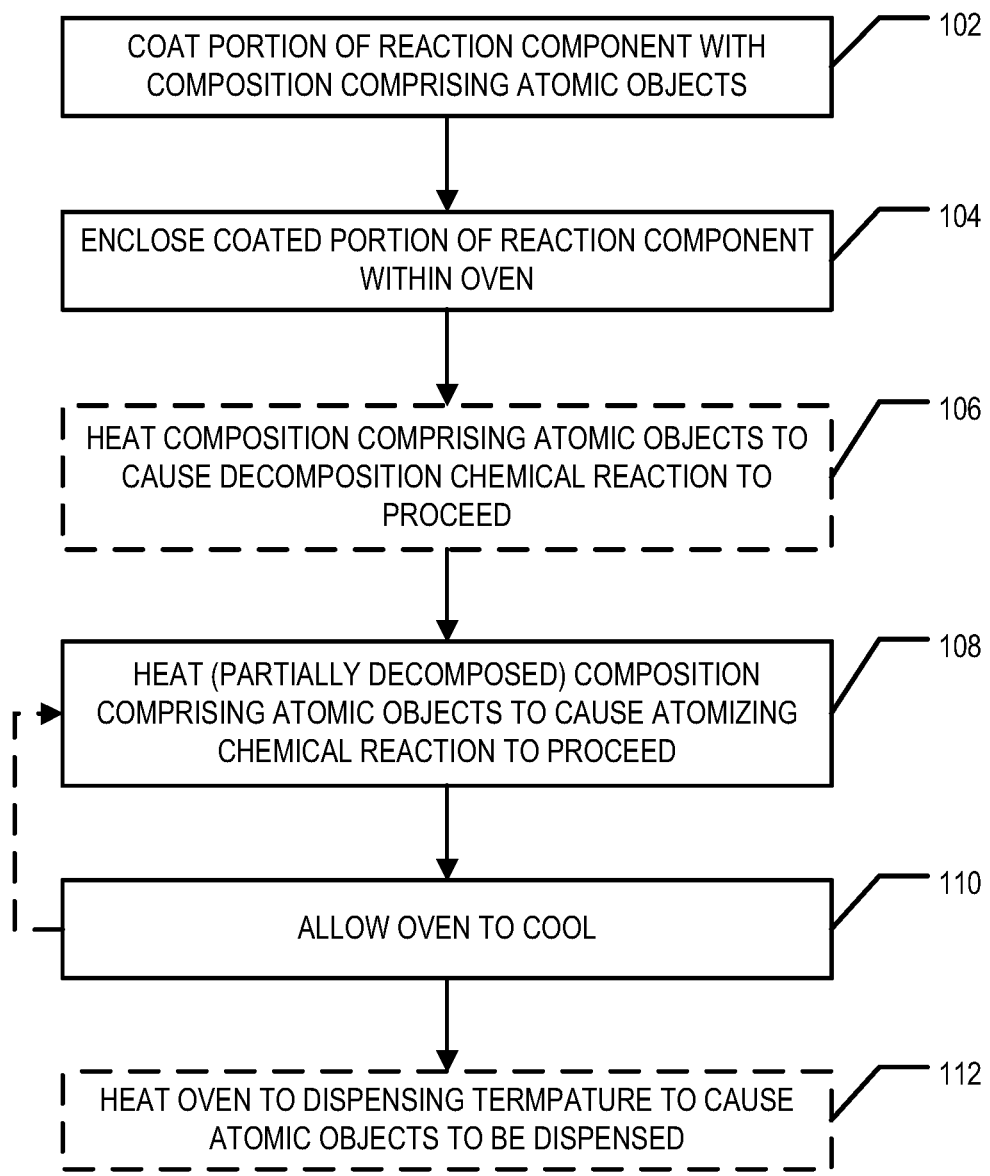

(51) Int. Cl.
  *G21K 1/00* (2006.01)
  *H05H 3/02* (2006.01)
  *C23C 16/06* (2006.01)
  *C23C 16/455* (2006.01)

(52) U.S. Cl.
  CPC ........ *C23C 16/06* (2013.01); *C23C 16/45544* (2013.01)

(56) References Cited

U.S. PATENT DOCUMENTS

| | | | |
|---|---|---|---|
| 2006/0257296 A1* | 11/2006 | Lipp | H05H 3/02 422/159 |
| 2011/0290991 A1 | 12/2011 | Booth et al. | |
| 2016/0105149 A1* | 4/2016 | Ishihara | G04F 5/145 53/467 |
| 2019/0138928 A1 | 5/2019 | Monroe et al. | |
| 2019/0212766 A1 | 7/2019 | Monroe et al. | |
| 2019/0215945 A1 | 7/2019 | Amini et al. | |
| 2020/0002802 A1* | 1/2020 | Kitching | B23K 1/20 |

FOREIGN PATENT DOCUMENTS

| | | |
|---|---|---|
| EP | 3455385 A1 | 3/2019 |
| KR | 10-2019-0087857 A | 7/2019 |
| WO | 2017/189443 A1 | 11/2017 |

OTHER PUBLICATIONS

Decision to grant a European patent dated May 8, 2023 for EP Application No. 21192673, 2 page(s).

Aldrich, L. T., "The Evaporation Products of Barium Oxide from Various Base Metals and of Strontium Oxide from Platinum", Journal of Applied Physics, Sep. 1951, pp. 1168-1174, vol. 22, No. 9, American Institute of Physics, US.

European Search Report and Search Opinion received for EP Application No. 21192673.8, dated Feb. 8, 2022, 5 pages.

Hucul, David, et al., "Spectroscopy of a synthetic trapped ion qubit", Phys. Rev. Lett. 119, 100501, May 30, 2017, retreived from the Internet at <URL://https://arxiv.org/pdf/1705.09736.pdf> on Dec. 9, 2021, 5 pages.

Kresse, Robert, et al., "Barium and Barium Compounds", Jul. 15, 2007, 21 pages, Wiley-VCH Verlag GmbH & Co., KGaA, Germany.

Lederer, E. A., et al., "'Batalum', A Barium Getter for Metal Tubes", RCA Review, Jul. 1937, pp. 117-123, vol. 2, RCA Manufacturing Company, US.

Sankey, J. D., et al., "The Production of Ions for Single-Ion Traps", Applied Physics B, Jul. 1989, pp. 69-72, retrieved from the Internet at <https://www.researchgate.net/publications/44070215> on Jul. 29, 2020.

CN Office Action, including Search Report dated Jul. 29, 2023 for CN Application No. 202111017705, 6 page(s).

English Translation of CN Office Action dated Jul. 29, 2023 for CN Application No. 202111017705, 1 page(s).

CN Notice of Allowance Mailed on Jan. 2, 2024 for CN Application No. 202111017705, 2 page(s).

English translation of CN Notice of Allowance dated Jan. 2, 2024 for CN Application No. 202111017705, 3 page(s).

* cited by examiner

LOW TEMPERATURE LOW-ABUNDANCE ATOMIC OBJECT DISPENSER

CROSS-REFERENCE TO RELATED APPLICATIONS

This application claims priority to U.S. Application No. 63/072,366, filed Aug. 31, 2020, the content of which is incorporated herein by reference in its entirety.

TECHNICAL FIELD

Various embodiments relate to apparatuses, systems, and methods relating to dispensing low-abundance atomic objects. For example, some example embodiments relate to the dispensing of low-abundance atomic objects at a temperature suitable for the trapping of the atomic objects.

BACKGROUND

An ion trap can use a combination of electrical and magnetic fields to capture a plurality of atomic objects in a potential well. Atomic objects can be trapped for a number of purposes, which may include mass spectrometry, research, and/or controlling quantum states, for example. In some instances, the atomic objects to be trapped may only be available in small amounts. For example, the atomic objects may be radioactive or pose another safety concern in large amounts, be very expensive, be hard to obtain or make, and/or the like. Additionally, in some instances, the atomic objects are available in their elemental form as a result of a high temperature chemical reaction such that the atomic objects have too much kinetic energy for efficient trapping of the atomic objects. Through applied effort, ingenuity, and innovation many deficiencies of prior atomic object dispensers and/or dispensing techniques have been solved by developing solutions that are structured in accordance with the embodiments of the present invention, many examples of which are described in detail herein.

BRIEF SUMMARY OF EXAMPLE EMBODIMENTS

Example embodiments provide methods, systems, apparatuses, computer program products and/or the like for the dispensing of atomic objects using only a small amount of a composition comprising the atomic objects and such that the temperature of the atomic objects is low enough that the kinetic energy of the dispensed atomic objects permits them to be trapped and/or confined within an atomic object confinement apparatus. For example, various embodiments may be used to load an atomic object confinement apparatus (e.g., a surface ion trap, a three-dimensional ion trap, a magneto-optical trap, and/or the like) with atomic objects that are only available in a small amount due to safety, availability, and/or other concerns. For example, various embodiments provide methods and/or atomic object dispensers for loading an atomic object confinement apparatus with radioactive atomic objects (e.g., $^{133}$Ba). In various embodiments, an atomic object is an ion or an atom.

In various embodiments, the atomic objects are available and/or provided as part of a composition comprising the atomic objects. In various embodiments, the composition comprising the atomic objects must undergo at least one decomposition and/or atomizing chemical reaction to generate elemental atomic objects (e.g., atomic objects that are individual atomic objects rather than part of a molecule). In various embodiments, the atomizing chemical reaction occurs at an atomizing reaction temperature which is significantly higher than the dispensing threshold temperature. For example, the dispensing threshold temperature may be a maximum temperature that atomic objects may be loaded into an atomic object confinement apparatus and efficiently and/or effectively trapped and/or confined. As should be understood, the dispensing threshold temperature may be dependent on the atomic object confinement apparatus being loaded with the atomic objects.

According to a first aspect of the present disclosure, a method for dispensing atomic objects is provided. In an example embodiment, the method comprises sealing a reaction component at least partially coated with a composition comprising the atomic objects inside an oven with the oven disposed within a pressure-controlled chamber; and, with the oven disposed within a pressure-controlled chamber, heating the composition comprising the atomic objects to an atomizing reaction temperature to cause an atomizing chemical reaction to occur. The reaction component comprises a material that is a participant in the atomizing chemical reaction. A result of the atomizing chemical reaction is elemental atomic objects deposited on a depositing surface within the oven. The atomizing reaction temperature is greater than a dispensing threshold temperature. The method further comprises allowing the oven to cool to below the dispensing threshold temperature; and heating the oven to a dispensing temperature to cause the elemental atomic objects to be dispensed from the oven through a dispensing aperture. The dispensing temperature is less than or equal to the dispensing threshold temperature.

In an example embodiment, the atomizing chemical reaction is a reduction reaction and the material is a reducing agent in the atomizing chemical reaction. In an example embodiment, the method further comprises, before the causing of the atomizing chemical reaction, heating the oven to a decomposition reaction temperature to cause a decomposition chemical reaction to occur, wherein the atomizing chemical reaction is performed using at least a portion of the molecules generated by the decomposition chemical reaction. In an example embodiment, the dispenser is coupled to a first pressure-controlled chamber during the decomposition chemical reaction and coupled to a second pressure-controlled chamber during the dispensing of the atomic objects. In an example embodiment, the atomic objects are barium (Ba) atoms, the material is tantalum (Ta), the atomizing reaction temperature is at least 900° C., and the dispensing threshold temperature is in a range of 300-500° C. In an example embodiment, the temperature of the depositing surface is controlled by at least one of (a) an active cooling component, (b) a passive cooling component, or (c) a series of heating cooling steps performed during the atomizing chemical reaction. In an example embodiment, the atomic objects are radioactive. In an example embodiment, the method further comprising trapping dispensed elemental atomic objects using an atomic object confinement apparatus. In an example embodiment, the atomic object confinement apparatus is a component of a quantum computer. In an example embodiment, the reaction component comprises a filament and heating the composition comprising the atomic objects is performed by supplying an electric current to the filament.

According to another aspect of the present disclosure, a dispenser for dispensing atomic objects is provided. In an example embodiment, the dispenser comprises an oven and a heating component configured to heat a composition comprising the atomic objects within the oven. The oven comprises oven walls defining a tube, a base cap closing off one end of the tube, and an aperture cap at least partially closing off an opposite end of the tube. The oven walls, base cap, and aperture cap define a crucible chamber of the oven. The oven further comprises a depositing surface located within the crucible chamber. A temperature of the depositing surface is controlled when the heating component heats the composition comprising the atomic objects to an atomizing reaction temperature to cause an atomizing chemical reaction to occur. A result of the atomizing chemical reaction is elemental atomic objects deposited on the depositing surface. The atomizing reaction temperature is greater than a dispensing threshold temperature. The heating component is configured to allow the oven to cool after the atomizing chemical reaction is performed and then heat the oven to a dispensing temperature to cause the elemental atomic objects to be dispensed from the oven through a dispensing aperture in the aperture cap. The dispensing temperature is less than or equal to the dispensing threshold temperature.

In an example embodiment, the heating component comprises at least one filament, a portion of the filament is at least partially coated with the composition comprising the atomic objects, the portion of the filament is disposed within the oven, and a component of the filament is a participant in the atomizing chemical reaction. In an example embodiment, the atomizing chemical reaction is a reduction reaction and the component of the filament is a reducing agent in the atomizing chemical reaction. In an example embodiment, the atomic objects are barium (Ba) atoms, the filament comprises tantalum (Ta), and the atomizing reaction temperature is at least 900° C. In an example embodiment, the dispenser further comprises a cooling component configured to cool the depositing surface. In an example embodiment, the cooling component comprises an externally cooled thermally conductive tube in thermal contact with an exterior surface of the oven walls. In an example embodiment, the dispenser further comprises a flange configured to couple a portion of the dispenser comprising the oven within a pressure-controlled chamber, wherein a portion of the thermally conductive tube disposed opposite the flange from the oven is water cooled. In an example embodiment, the cooling component is a passive cooling component. In an example embodiment, the dispensing threshold temperature is in a range of 300-500° C. In an example embodiment, the atomic objects are radioactive.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIG. 1 is a flowchart illustrating various processes, operations, and/or procedures for dispensing atomic objects, in accordance with an example embodiment.

Figure 2A:
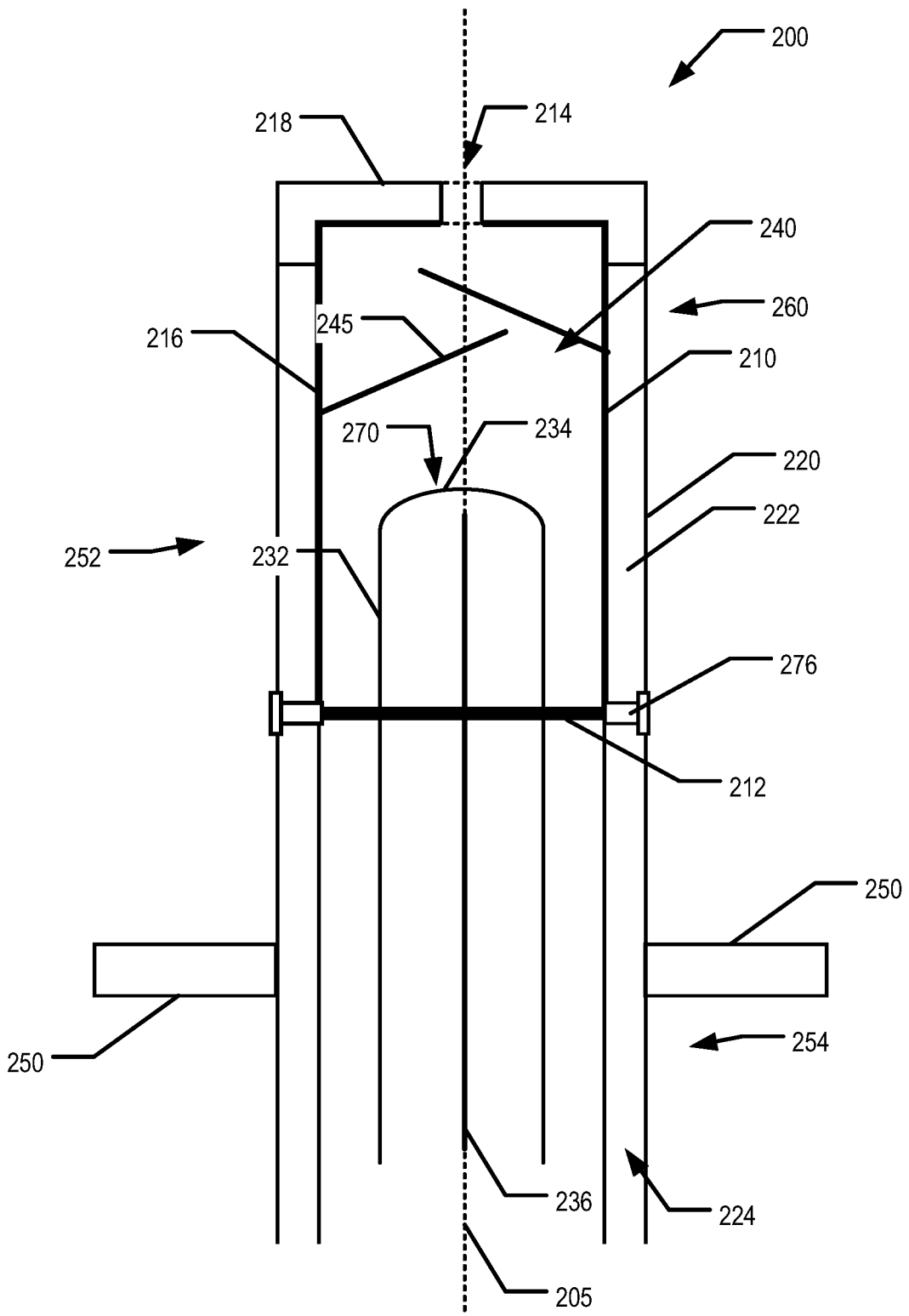

FIG. 2A provides a cross-sectional view of an example dispenser, in accordance with an example embodiment.

Figure 2B:
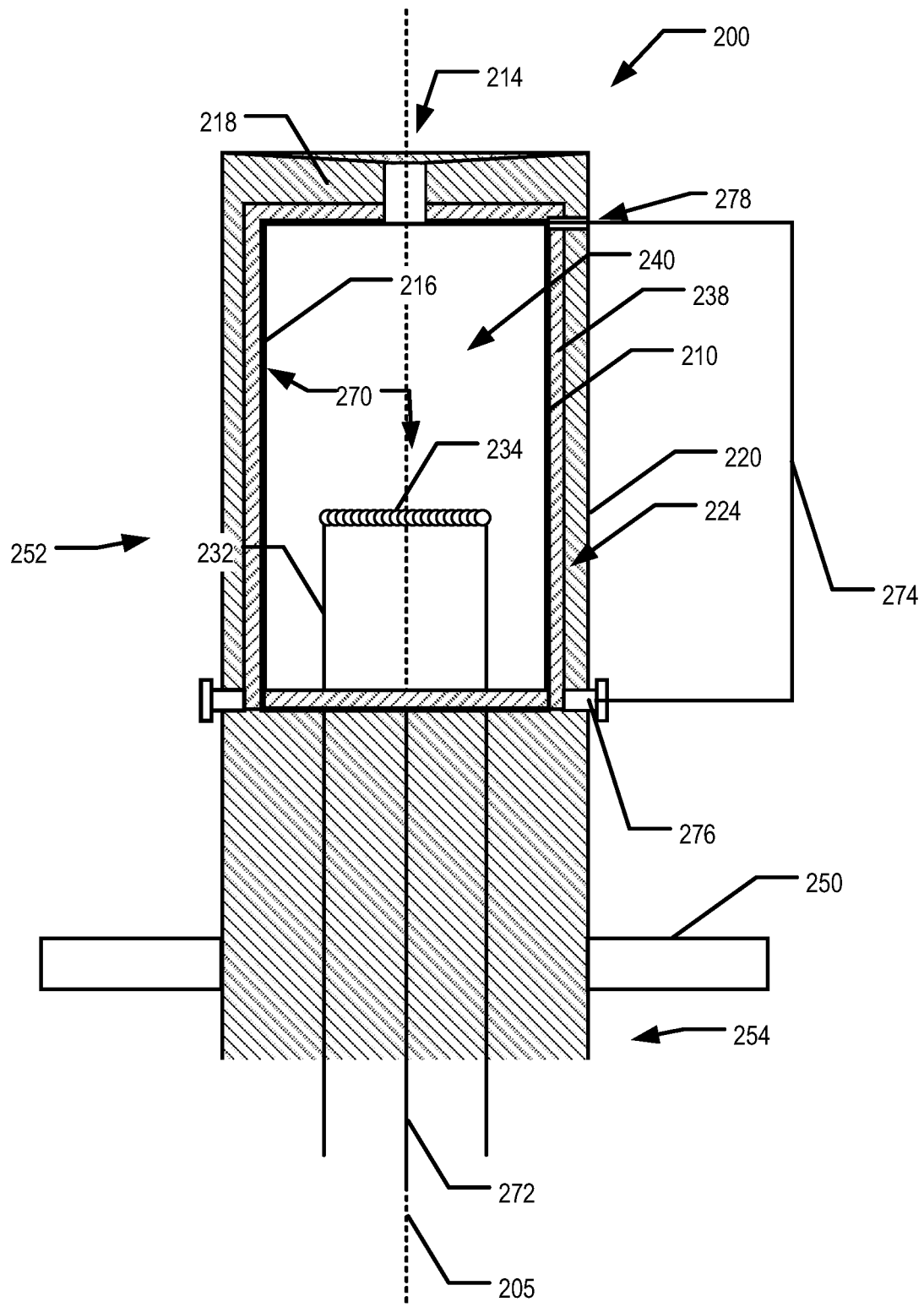

FIG. 2B provides a cross-sectional view of another example dispenser, in accordance with an example embodiment.

Figure 3:
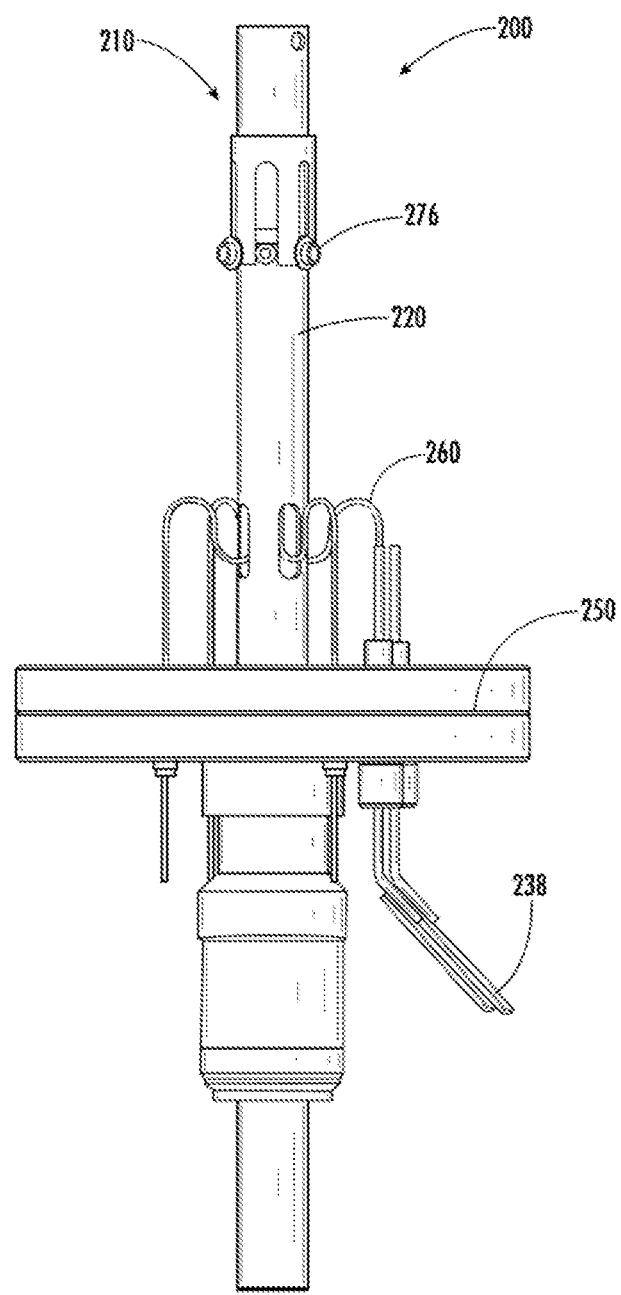

FIG. 3 provides a sideview of an example dispenser, in accordance with an example embodiment.

Figure 4:
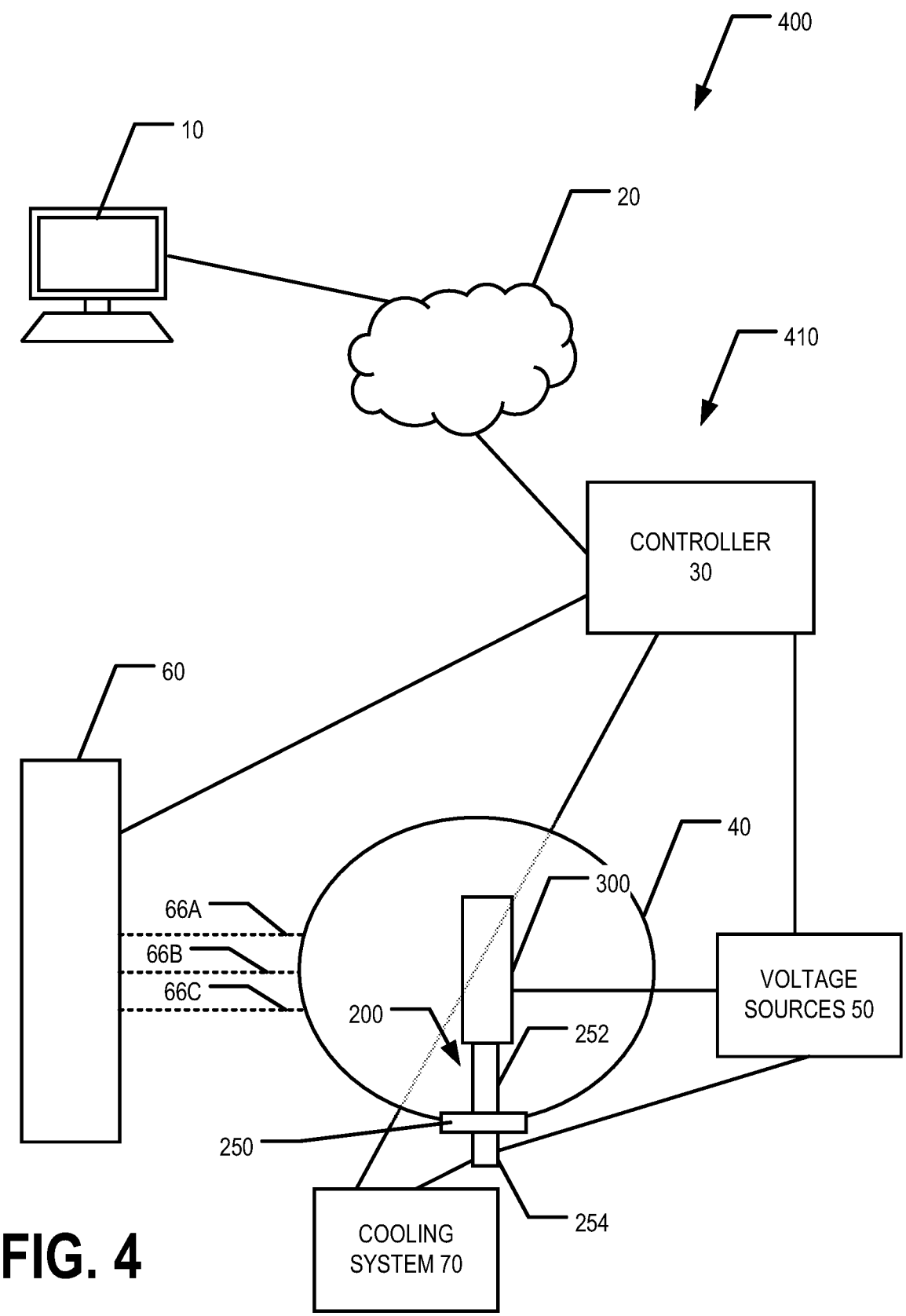

FIG. 4 is a schematic diagram illustrating an example quantum computing system comprising an atomic object confinement apparatus loaded with atomic objects using a dispenser of an example embodiment.

Figure 5:
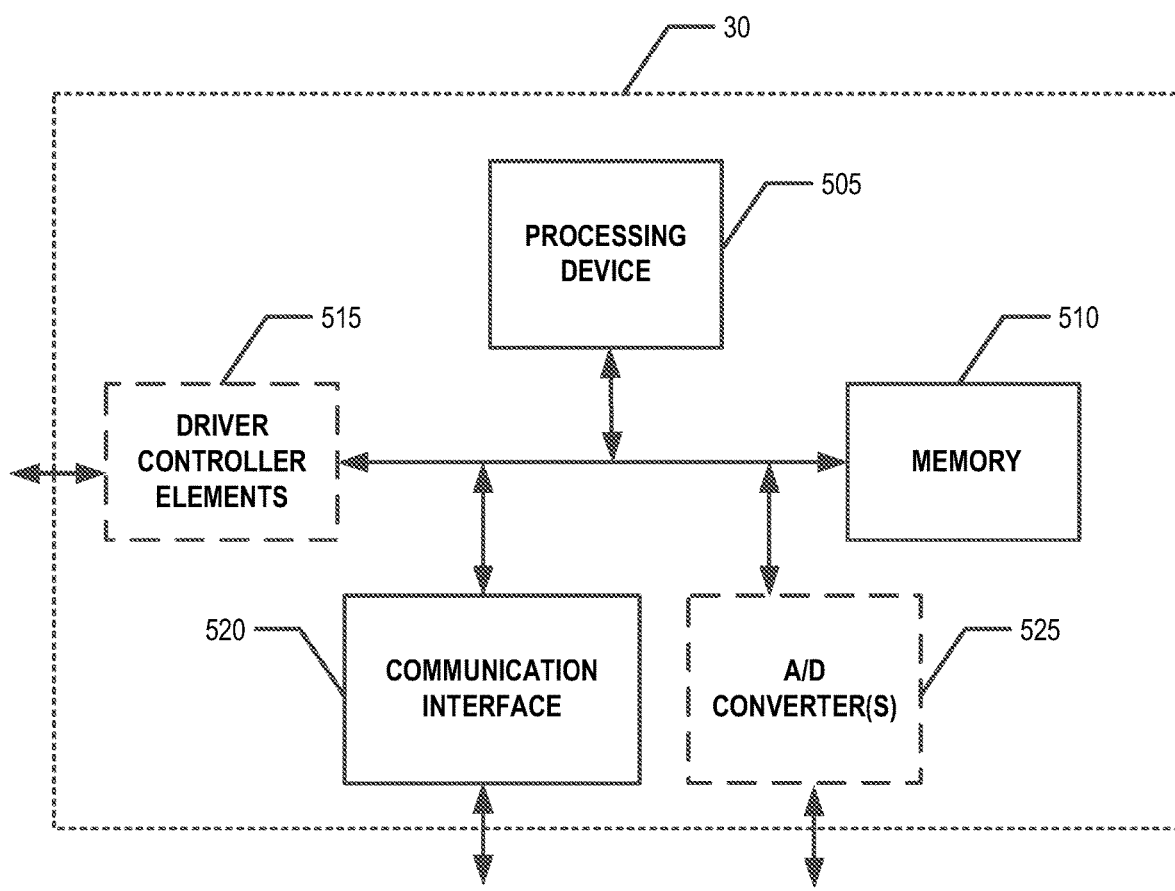

FIG. 5 provides a schematic diagram of an example controller of a quantum computer configured to perform one or more deterministic reshaping and/or reordering functions, according to various embodiments.

Figure 6:
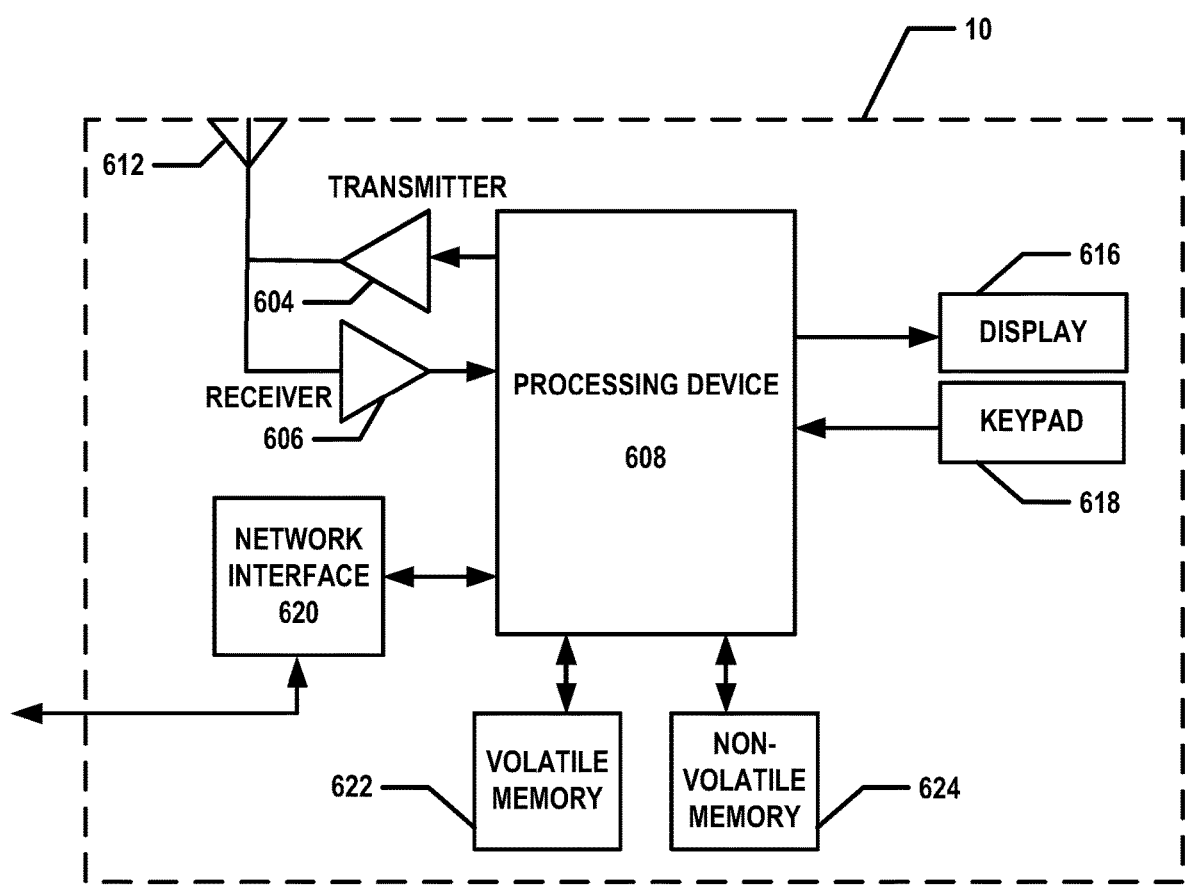

FIG. 6 provides a schematic diagram of an example computing entity of a quantum computer system that may be used in accordance with an example embodiment.

DETAILED DESCRIPTION OF SOME EXAMPLE EMBODIMENTS

The present invention now will be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. The term "or" (also denoted "/") is used herein in both the alternative and conjunctive sense, unless otherwise indicated. The terms "illustrative" and "exemplary" are used to be examples with no indication of quality level. The terms "generally," "substantially," and "approximately" refer to within engineering and/or manufacturing tolerances and/or within user measurement capabilities, unless otherwise indicated. Like numbers refer to like elements throughout.

In various embodiments, methods, apparatuses, systems, computer program products, and/or the like for the dispensing of atomic objects using only a small amount of a composition comprising the atomic objects and such that the temperature of the atomic objects is low enough that the kinetic energy of the atomic objects permits them to be trapped and/or confined within an atomic object confinement apparatus. For example, various embodiments may be used to load an atomic object confinement apparatus (e.g., a surface ion trap, a three-dimensional ion trap, a magneto-optical trap, and/or the like) with atomic objects that are only available in a small amount due to safety, availability, and/or other concerns. For example, various embodiments provide methods and/or atomic object dispensers for loading an atomic object confinement apparatus with radioactive atomic objects (e.g., $^{133}$Ba). In various embodiments, an atomic object is an ion or an atom.

In various embodiments, the atomic objects are available and/or provided as part of a composition comprising the atomic objects. In various embodiments, the composition comprising the atomic objects must undergo at least one decomposition and/or atomizing chemical reaction to generate elemental atomic objects (e.g., atomic objects that are individual atomic objects rather than part of a molecule). For example, a composition comprising the atomic objects may be heated to a decomposing reaction temperature to cause a decomposition chemical reaction to occur to generate a partially decomposed composition comprising the atomic objects. The partially decomposed composition comprising the atomic objects may be heated to an atomizing reaction temperature to cause an atomizing chemical reaction to occur to generate elemental atomic objects. In some embodiments, the atomizing chemical reaction may be used to generate elemental atomic objects from the composition comprising the atomic objects (e.g., a decomposition chemical reaction may not be necessary in some embodiments). In an example embodiment, a deposition surface within the oven of the dispenser may be temperature-controlled such that at least some of the elemental atomic objects resulting from the atomizing chemical reaction are deposited on the temperature-controlled deposition surface.

As used herein, an atomizing chemical reaction is a chemical reaction that starts with the composition comprising atomic objects and/or a partially decomposed composition comprising the atomic objects and results in elemental atomic objects. As used herein, a decomposing chemical reaction is a chemical reaction that starts with a composition comprising atomic objects and results in a partially decomposed composition comprising the atomic objects but with a significant fraction of the atomic objects not being in elemental form (e.g., being part of a molecule).

In various embodiments, the atomizing reaction temperature is significantly higher than the dispensing threshold temperature of the atomic object confinement apparatus to be loaded with the atomic objects. For example, the dispensing threshold temperature may be a maximum temperature that atomic objects may be loaded into an atomic object confinement apparatus and efficiently trapped and/or confined (possibly after the atomic object is photoionized or otherwise ionized). In various embodiments, atomic objects are efficiently trapped and/or confined in an atomic object confinement apparatus into which the atomic objects are being loaded when at least a threshold ratio and/or percentage of atomic objects that are dispensed into the atomic object confinement apparatus are capable of being trapped by the atomic object confinement apparatus. An atomic object is capable of being trapped by the atomic object confinement apparatus when the kinetic energy of the atomic object dispensed into the atomic object confinement apparatus is no more than the potential well depth generated by the atomic object confinement apparatus at a loading position thereof. As should be understood, for a population of atomic objects (e.g., atomic objects being dispensed from the dispenser 200), the average kinetic energy $E_k$ of atomic objects in the population of atomic objects is given by $E_k \cdot \cancel{?} \cdot 2kT$, where k is Boltzmann's constant and T is the temperature of the population of atomic objects in Kelvin. In an example embodiment, the dispensing temperature is configured so that the average kinetic energy $E_k$ of atomic objects being dispensed through the dispensing aperture 214 is approximately 0.4-0.6 times the potential well depth (e.g., approximately 0.5 times the potential well depth) of the atomic object confinement apparatus at a loading location such that the atomic object confinement apparatus is capable of efficiently trapping atomic objects dispensed from the dispenser 200 (possibly after photoionization or otherwise ionizing the atomic objects). As should be understood, the dispensing threshold temperature may be dependent on the atomic object confinement apparatus being loaded with the atomic objects (e.g., different atomic object confinement apparatuses may generate potential wells of different depths at the loading location of the atomic object confinement apparatus).

For example, in an example embodiment, the atomic objects are radioactive barium $^{133}$Ba. For example, due to the radioactivity of radioactive barium $^{133}$Ba, safety concerns prevent large amounts of radioactive barium $^{133}$Ba from being readily available and/or being able to be used safely. Moreover, due to the difficulty in generating radioactive barium $^{133}$Ba, which is a synthetic element and is not found in nature, radioactive barium is generally not available in an elemental form. In an example embodiment wherein the atomic objects are radioactive barium $^{133}$Ba, the composition comprising the atomic objects may be radioactive barium nitrate $^{133}$Ba(NO$_3$)$_2$. A decomposing chemical reaction may be performed at a decomposing reaction temperature such that the radioactive barium nitrate is decomposed into radioactive barium oxide (e.g., $2^{133}$Ba(NO$_3$)$_2 \rightarrow 2^{133}$BaO+4NO$_2$+O$_2$). In this example, the decomposing reaction temperature is approximately 630° C. An atomizing chemical reaction may then be performed at an atomizing reaction temperature such that the radioactive barium oxide is decomposed to generate elemental radioactive barium (e.g., $5^{133}$BaO+2Ta$\rightarrow 5^{133}$Ba+Ta$_2$O$_5$, when tantalum (Ta) is used as the reducing agent). In this example embodiment, the atomizing reaction temperature is at least 900° C. and may be greater than 1000° C. In various embodiments, the dispensing threshold temperature is approximately 300-500° C. In an example embodiment in which the atomic object confinement apparatus to be loaded with atomic objects is a surface ion trap, the dispensing threshold temperature is approximately 300-400° C. (e.g., approximately 350° C.). Thus, the atomizing reaction temperature is significantly higher than the dispensing threshold temperature. In particular, the distribution of kinetic energy of a population of atomic objects is described by the Boltzmann distribution, which is exponential with respect to temperature. Thus, dispensing atomic objects at a temperature of 900° C. or higher, would result in nearly all of the dispensed atomic objects not being capturable by the atomic object confinement apparatus.

FIG. 1 provides a flowchart illustrating an example technique for dispensing atomic objects from a dispenser using only a small amount of a composition comprising the atomic objects and for which an atomizing reaction occurs at a temperature that is greater than the dispensing threshold temperature. Some example embodiments of dispensers that may be used to dispense atomic objects using only a small amount of a composition comprising the atomic objects and for which an atomizing reaction occurs at a temperature that is greater than the dispensing threshold temperature are shown in FIGS. 2A, 2B, and 3. In particular, FIGS. 2A, 2B, and 3 illustrate cross-sections and a side view of some example embodiments of a dispenser 200. In various embodiments, a dispenser 200 comprises an oven 210 configured to have a decomposition and/or atomizing chemical reaction occur therein. For example, the oven 210 is configured to contain a reaction component at least partially coated with a composition comprising the atomic objects and comprises a depositing surface upon which atomic objects are deposited during the atomizing chemical reaction. The dispenser 200 further comprises a heating component 270 configured to heat at least a portion of the oven 210. In various embodiments, the heating component 270 comprises a first heating element and a second heating element. The dispenser 200 further comprises an exterior tube 220 coupled to a flange 250. The oven 210 is coupled and/or secured within an end of the exterior tube 220. For example, the oven 210 may be mounted within the exterior tube 220 and the exterior tube 220 may be coupled to the flange 250. The flange 250 may be configured to secure the dispenser 200 to a pressure-controlled chamber such that the oven 210 is disposed within the pressure-controlled chamber. For example, the flange 250 may be configured to secure the dispenser 200 to a pressure-controlled chamber such that the atomic objects are dispensed into the pressure-controlled chamber. In various embodiments, the dispenser 200 further comprising a cooling component 260. In various embodiments, the cooling component 260 may be configured to actively or passively cool at least a portion of the oven 210.

Various other dispensers may be used in various embodiments. For example, in general, FIG. 2A illustrates an example embodiment of a dispenser 200 wherein the heating component 270 comprises a secondary heating element that is a secondary filament 236 and the dispenser 200 comprises an active cooling component 260. The example embodiment of the dispenser 200 illustrated in FIG. 2A also includes one or more baffle structures 245 and a continuous primary filament 232. In general, FIG. 2B illustrates an example embodiment of a dispenser 200 wherein the heating component 270 comprises a secondary heating element that is the oven walls 216 and the dispenser 200 does not include an active cooling component 260. The example embodiment of the dispenser 200 illustrated in FIG. 2B comprises a primary filament 232 having a central thin wire coil, rather than a continuous filament. Some example embodiments are similar to those shown in FIGS. 2A and 2B but with the baffle structures 245 removed from the dispenser 200 shown in FIG. 2A or the baffle structures 245 added to the dispenser 200 shown in FIG. 2B. Similarly, an embodiment similar to that shown in FIG. 2A may include a primary filament 232 having a central thin wire coil and an embodiment similar to that shown in FIG. 2B could contain a continuous primary filament 232. An example embodiment is similar to that shown in FIG. 2B, but comprising an active or passive cooling component 260. Various features of various embodiments of a dispenser 200 will now be described in more detail.

In various embodiments, the oven 210 comprises oven walls 216 defining a tube. In an example embodiment, the tube defined by the oven walls 216 is generally cylindrical and/or semi-conical. For example, a cross-section of the tube defined by the oven walls 216 taken in a plane substantially perpendicular to a longitudinal axis 205 defined by the tube may be circular. In various other embodiments, the cross-section of the tube defined by the oven walls 216 taken in a plane substantially perpendicular to a longitudinal axis 205 defined by the tube may have various shapes, such as a regular or irregular polygon, ellipse, and/or the like, as appropriate for the application. In various embodiments, the length of the tube defined by the oven walls 216 in a direction substantially parallel to the longitudinal axis 205 is greater than a width (e.g., radius or diameter) of the tube in a plane substantially perpendicular to the longitudinal axis 205. For example, in one example embodiment, the length of tube defined by the oven walls 216 along the longitudinal axis 205 is approximately one inch and a diameter of the tube in a cross-section taken generally perpendicular to the longitudinal axis 205 is in the range of 0.3 to 0.4 inches.

In various embodiments, the oven walls 216 are the depositing surface and/or at least one of the depositing surfaces within the oven 210. For example, the temperature of the depositing surfaces (e.g., the interior surface of the oven walls 216) may be controlled such that during the atomizing chemical reaction, elemental atomic objects are deposited onto depositing surfaces. In various embodiments, the oven walls 216 may be made of a conductive material such as stainless steel, aluminum, and/or the like. For example, in an example embodiment, the oven walls 216 are part of the heating component 270 (e.g., the oven walls may be a secondary heating element) and the oven walls 216 are made of a conductive material having a resistance that enables heating of the oven walls 216 by application of an electric current and/or voltage thereto. In an example embodiment comprising a cooling component 260 (e.g., active or passive cooling component), the oven walls 216 may be made of a thermally conductive material. In an example embodiment, the oven walls 216 are made of an electrically insulating and/or thermally insulating material. For example, the oven walls 216 may be made, at least in part of boron nitride, a ceramic, a glass-ceramic (e.g., MACOR), and/or the like.

In various embodiments, the oven 210 further comprises a base cap 212 that closes off one end of the tube defined by the oven walls 216. In various embodiments, the base cap 212 seals one end of the tube defined by the oven walls 216. For example, the base cap 212 may be secured within one end of the tube defined by the oven walls 216. In an example embodiment, the base cap 212 is secured within the end of the tube via fasteners securing the base cap 212 to the oven walls, adhesive securing the base cap 212 to the oven walls, a friction fit of the base cap 212 to the oven walls 216, and/or the like. In an example embodiment, a layer of another material may be disposed between the oven walls 216 and the edge of the base cap 212. In various embodiments, the base cap 212 is made of a material that can withstand the temperature of the portion of the filament 232 passing through the base cap 212 during the decomposition and/or atomizing chemical reaction without melting or otherwise deforming. In an example embodiment, the base cap 212 is made of an electrically insulating material. In an example embodiment, the base cap 212 is made at least in part of a ceramic and/or glass-ceramic (such as MACOR), aluminum, and/or the like. In an example embodiment, the base cap 212 has a melting temperature that is significantly greater than the atomizing reaction temperature. For example, the base cap 212 may have a melting temperature that is greater than 1500° C. In an example embodiment, the base cap 212 is made at least in part of boron nitride.

In an example embodiment, the base cap 212 is a button. For example, the base cap 212 may be a disc of material having one or more pairs of through holes therein. In an example embodiment, the pairs of through holes are each configured to have a filament (e.g., 232, 236) pass therethrough. In an example embodiment, the filaments passing through the pair of through holes may substantially seal and/or fill the pair of through holes in the base cap 212. In various embodiments, one or more of the filaments 232, 236 may be a reaction component at least partially coated with the composition comprising the atomic objects. In an example embodiment, one or more of the filaments 232, 236 are part of the heating component 270. For example, the reaction component may be the primary filament 232 which may be the primary heating element of the heating component 270.

In various embodiments, the oven 210 further comprises an aperture cap 218 that at least partially closes off the end of the tube defined by the oven walls 216 that is opposite the end where the base cap 212 is disposed. For example, the base cap 212 may close off a first end of the tube defined by the oven walls 216 and the aperture cap 218 may at least partially close off a second, opposite end of the tube defined by the oven walls 216. The oven walls 216, base cap 212, and aperture cap 218 define a crucible chamber 240 of the oven 210. In various embodiments, the aperture cap 218 comprises a dispensing aperture 214. In various embodiments, the elemental atomic objects are dispensed from the dispenser 200 through the dispensing aperture 214. For example, the aperture cap 218 may be secured within one end of the tube defined by the oven walls 216. In an example embodiment, the aperture cap 218 is secured within the end of the tube via fasteners securing the aperture cap 218 to the oven walls, adhesive securing the aperture cap 218 to the oven walls, a friction fit of the aperture cap 218 to the oven walls 216, and/or the like. In an example embodiment, a layer of another material may be disposed between the oven walls 216 and the edge of the aperture cap 218. In an example embodiment, the aperture cap 218 is a disc comprising a dispensing aperture 214 extending therethrough.

In an example embodiment, the dispensing aperture 214 has a diameter (measured in a plane substantially perpendicular to the longitudinal axis 205) of approximately 0.05-1.2 mm. In an example embodiment, the dispensing aperture 214 has a channel length (measured substantially parallel to the longitudinal axis 205) that is approximately 0.5-6 mm. In an example embodiment, the diameter and channel length of the dispensing aperture 214 are configured to provide an at least semi-collimated beam of atomic objects directed toward a load hole and/or target component of an atomic object confinement apparatus. In an example embodiment, the aperture cap 218 comprises multiple dispensing apertures 214.

In an example embodiment, the dispensing aperture 214 is centered in the aperture cap 218. In various embodiments, the dispensing aperture 214 is not centered in the aperture cap 218. In various embodiments, the dispensing aperture 214 is disposed such that the dispensing aperture 214 is not in the direct line of sight of a reaction component within the oven 210 coated with a composition comprising the atomic objects such that molecules and/or atomic objects passing through the dispensing aperture 214 is reduced and/or minimized during the decomposition chemical reaction and/or the atomizing chemical reaction. In various embodiments, the oven 210 comprises one or more baffle structures 245 located within the crucible chamber 240 (e.g., extending into the crucible chamber 240 from the oven walls 216, aperture cap 218, and/or the like), for example, that act to prevent and/or reduce the number of atomic objects and/or molecules that pass through the dispensing aperture 214 during the decomposition chemical reaction and/or the atomizing chemical reaction. For example, the one or more baffle structures 245 may cause the dispensing aperture 214 to not be in the direct line of sight of a reaction component within the oven 210 coated with a composition comprising the atomic objects such that molecules and/or atomic objects passing through the dispensing aperture 214 is reduced and/or minimized during the decomposition chemical reaction and/or the atomizing chemical reaction. In an example embodiment, the baffle structures 245 are made of the same material as the oven walls 216, though various other materials may be used in various other embodiments.

In various embodiments, the oven walls 216, base cap 212, and aperture cap 218 define a crucible chamber 240 of the oven 210. In various embodiments, the crucible chamber 240 is the volume and/or cavity within the interior of the oven 210. For example, the decomposition chemical reaction and the atomizing chemical reaction may occur within the crucible chamber 240.

In various embodiments, the dispenser 200 comprises a heating component 270. In various embodiments, the heating component 270 comprises a primary heating element and a secondary heating element. In an example embodiment, the reaction component is also the primary heating element. For example, the primary heating element may be primary filament 232. In an example embodiment, at least a central portion 234 of the primary filament 232 is coated with the composition comprising the atomic objects.

In an example embodiment, the secondary heating element is secondary filament 236. The secondary heating element may be disposed within the oven 210 (as shown for secondary filament 236 in FIG. 2A), be the oven walls 216 themselves (as shown in FIG. 2B), or be located external to the oven 210 (e.g., the secondary filament 236 may be disposed external to but still in thermal communication with the oven 210). In an example embodiment, the heating component 270 is operated by supplying an electric current and/or voltage to one or more of the primary or secondary heating elements. For example, an electric current and/or voltage may be applied to the primary filament 232 to heat the composition comprising the atomic objects and/or a partially decomposed composition comprising the atomic objects. For example, an electric current and/or voltage may be applied to the secondary filament 236 and/or the oven walls 216 to cause at least a portion of the oven 210.

In an example embodiment, a central portion 234 of a primary filament 232 is coated with a composition comprising the atomic objects. For example, the primary filament 232 may be the reaction component. For example, a primary filament 232 may be disposed at least in part in a pair of through holes in the base cap 212 such that at least a central portion 234 of the primary filament is located within the crucible chamber 240 and the ends of the primary filament are located exterior to the crucible chamber 240. The ends of the primary filament 232 may be secured in electrical communication with electrical leads that may be used to supply electric current and/or voltage to the primary filament 232. When electric current and/or voltage are applied to the primary filament 232, the filament may emit heat and cause the composition comprising the atomic objects and/or the oven 210 to be heated (e.g., to a decomposition reaction temperature and/or atomizing reaction temperature) such that the decomposition chemical reaction and/or atomizing chemical reaction may proceed.

In an example embodiment, the primary filament 232 comprises tantalum. In an example embodiment, the primary filament 232 is a continuous filament, as illustrated in FIG. 2A. For example, the primary filament 232 may be a wire having the same thickness along the entire length thereof. In an example embodiment, the primary filament 232 is a (continuous) wire that has been folded over on itself. In an example embodiment, the primary filament 232 comprises a first wire, a second wire, and a coil of wire. The coil of wire is the central portion 234 (e.g., the portion of the primary filament coated with the composition comprising the atomic objects) of the primary filament 232 and is electrically and physically coupled to the first wire on one end and electrically and physically coupled to the second wire on a second, opposite end of the wire coil. The wire of the wire coil may be thinner than the first and second wires such that the wire coil may generate a sufficient amount of heat when a current and/or voltage is applied thereto, and the thicker first and second wires are not as hot as the wire coil (e.g., the first and second wires may have temperatures lower than the atomizing reaction temperature near and/or at the base cap 212).

When electric current and/or voltage are applied to the secondary heating element, the secondary heating element may emit heat and cause the composition comprising the atomic objects and/or partially decomposed composition comprising the atomic objects and/or at least a portion of the oven 210 to be heated (e.g., to a decomposition reaction temperature, atomizing reaction temperature, and/or dispensing temperature) such that the decomposition chemical reaction, atomizing chemical reaction, and/or dispensing of elemental atomic objects may proceed.

In an example embodiment wherein the secondary heating element comprises a secondary filament 236 disposed within the crucible chamber 240. The secondary filament 236 may be disposed at least in part in a pair of through holes in the case cap 212 such that at least a portion of the secondary filament is located within the crucible chamber 240 and the ends of the secondary filament are located exterior to the crucible chamber 240. In an example embodiment, the secondary filament 236 is disposed exterior to the crucible chamber 240, the secondary filament may be wrapped around at least a portion of the exterior of the oven walls 216. In an example embodiment, the secondary heating element is the oven walls 216 themselves. In various embodiments the second heating element (e.g., ends of the secondary filament 236 and/or the oven walls 216) may be secured in electrical communication with electrical leads that may be used to supply electric current and/or voltage to the secondary heating element. For example, in an example embodiment wherein the oven walls 216 are the secondary heating element, a first lead 272 may extend through the center of the exterior tube 220 and be electrically and physically coupled to the oven walls 216. A second lead 274 may be electrically and physically coupled to the oven walls 216 via opening or port 278 located near the second end of the tube defined by the oven walls 216 (e.g., adjacent the aperture cap 218) and electrically and physically coupled to a fastener 276 configured to secure the oven 210 with the exterior tube 220. In an example embodiment, the electric and physical coupling of the second lead 274 to the fastener 276 may cause the second lead 274 to be electrically coupled to the exterior tube 220. In various embodiments, the exterior tube 220 may be made of a conductive material such as metal and/or copper.

In various embodiments, the secondary filament 236 comprise tantalum. In an example embodiment, the secondary filament 236 is a continuous filament. In an example embodiment, the secondary filament 236 is a wire that has been folded over on itself. In an example embodiment wherein the secondary heating element is the oven 210 itself (e.g., the oven walls 216), the oven walls 216 may comprise a conductive material and an electric current and/or voltage may be applied thereto such that the oven walls 216 generate heat (e.g., based on the resistance of the oven walls 216). When the secondary heating element is the oven itself (e.g., the oven walls 216), the cooling component 260 and/or the outer tube (e.g., copper tube) 220 is electrically isolated from the oven 210. For example, space 224 sandwiched between the oven walls 216 and the outer tube 220 of the dispenser may comprise an insulator 238 (e.g., electrically insulating material, air, and/or the like). For example, the insulator 238 may be a ceramic, glass-ceramic (e.g., MACOR), and/or the like.

In various embodiments, the oven 210 comprises one or more depositing surfaces. In various embodiments, the depositing surfaces comprise the interior surface(s) of the oven walls 216 (e.g., the surface of the oven walls 216 facing the crucible chamber 240). In various embodiments, the depositing surfaces may comprise the surface(s) of one or more baffle structures 245. In various embodiments, the temperature of the depositing surfaces is controlled. For example, the temperature of the depositing surfaces may be controlled such that elemental atomic objects are deposited on the depositing surface(s) during the atomizing chemical reaction and such that the elemental atomic objects are dispensed at the appropriate time. In various embodiments, at least a portion of controlling the temperature of the dispensing surfaces is accomplished by an active or passive cooling component 260. In various embodiments, the temperature of the dispensing surfaces is controlled to cause elemental atomic objects to be disposed thereon by heating at least a portion of the oven 210 (e.g., via the primary heating element) to cause the atomizing chemical reaction to proceed and then stopping supplying heat to the oven 210 when the depositing surface(s) reaches a cut-off temperature. The oven 210 may then be allowed to cool (passively or actively) until the depositing surfaces reach a reset temperature. At least a portion of the oven 210 may then be heated again (e.g., via the primary heating element). This cyclic heating and cooling of the oven 210 may continue until the atomizing chemical reaction has completed (e.g., the composition comprising the atomic objects and/or partially decomposed composition comprising the atomic objects has been depleted).

In embodiments of the dispenser 200 comprises a cooling component 260, the cooling component 260 is coupled to a portion of the oven 210 such that operation of the cooling component 260 acts to cool the portion of the oven 210 coupled to the cooling component 260. For example, the cooling component 260 may be coupled to one or more of the depositing surfaces. In an example embodiment, the depositing surfaces comprise the oven walls 216 (e.g., an interior surface of the oven walls 216) the cooling component 260 is coupled to the oven walls 216 such that operation of the cooling component 260 causes the oven walls 216 to be cooled. In an example embodiment, the cooling component 260 is configured to cool the portion of the oven 210 coupled to the cooling component to a temperature that is below the dispensing temperature and/or dispensing threshold temperature. For example, the cooling component 260 may be configured to maintain the depositing surface(s) at a temperature that does not surpass the cut-off temperature during the atomizing chemical reaction. For example, operation of the cooling component 260 may provide a cold finger that is in thermal communication with a portion of the oven 210 that is coupled to the cooling component 260. For example, the cooling component 260 may be configured to provide a localized cooled surface of the coupled portion of the oven 210. In an example embodiment, the cooling component 260 is configured to cool the portion of the oven 210 coupled to the cooling component to approximately 200° C. In an example embodiment, the cooling component 260 comprises cooling ducts and/or cooling jacket 222 disposed in a space 224 sandwiched between the oven walls 216 and the exterior tube (e.g., metal and/or copper tube) 220 of the dispenser 200. In an example embodiment, the cooling ducts and/or cooling jacket 222 is in thermal communication with and/or thermally coupled to the oven walls 216 such that the operation of the cooling components causes cooling fluid to be circulated through the cooling ducts and/or cooling jacket 222 causing the oven walls 216 to be cooled. The cooling fluid may be further circulated through a cooling system 70 (See FIG. 4) such that cool cooling fluid may be continuously supplied to the cooling ducts and/or cooling jacket 222 and warm fluid may be continuously removed from the cooling ducts and/or cooking jacket 222 during operation of the cooling component 260. In an example embodiment, the cooling fluid comprises water, though various other cooling fluids may be used in various other embodiments, as appropriate for the application.

In an example embodiment, the cooling component 260 is configured to reduce the number of atomic objects leaving the oven during the atomizing chemical reaction. In particular, the rate at which atomic objects leave the oven (e.g., via the dispensing aperture 214) is proportional to the internal pressure of atomic objects within the oven 210 (e.g., within the crucible chamber 240). Thus, the cooling component 260 may aid in preventing a significant amount of atomic objects from leaving the oven 210 during the atomizing chemical reaction by reducing the vapor pressure within the oven 210.

For example, the cooling component 260 may be configured to control the temperature of the depositing surface(s) such that elemental atomic objects are deposited thereon during the atomizing chemical reaction rather than contributing to the vapor pressure within the crucible chamber 240 and/or leaving the crucible chamber via the dispensing aperture 214.

In an example embodiment, the cooling component 260 is not an active cooling component. For example, the cooling component 260 and/or the exterior tube (e.g., metal/copper tube) 220 may act as a radiation shield for the oven 210 but not actively cool a portion of the oven. For example, in an embodiment wherein the secondary heating element is the oven itself (e.g., oven walls 216), the dispenser 200 may or may not include a cooling component 260 configured to actively cool at least a portion of the oven 210. In an example, embodiment, the cooling component 260 is a passive cooling component, such as a heat sink. For example, the cooling component 260 may be a heat sink comprising a mass of thermally conductive material in thermal communication with at least a portion of the oven 210 (e.g., the oven walls 216). For example, the mass of thermally conductive material may be disposed in the space 224 sandwiched between the exterior tube 220 and the oven walls 216.

In an example embodiment, the atomizing chemical reaction is performed as a series of short heatings of the oven (e.g., by the primary heating element) until a depositing surface of the oven (e.g., oven walls 216, baffle structures 245, and/or other surface within the oven 210) reach a cut-off temperature. In an example embodiment, the cut-off temperature may be configured to cause elemental atomic objects to become deposited on the depositing surface(s). The oven 210 may then be allowed to passively cool for a period of time and/or may be actively cooled by the cooling component 260 until the oven walls 216 reach a reset temperature. This cyclic heating and cooling may continue until the atomizing chemical reaction is completed (e.g., approximately all of the composition comprising the atomic objects and/or partially decomposed composition comprising the atomic objects has been reduced, in an example embodiment).

After completion of the atomizing chemical reaction, the oven 210 may be cooled (e.g., actively or passively) to below the dispensing threshold temperature. The secondary heating element (e.g., a secondary filament 236 located interior to or exterior to the oven 210, the oven walls 216, or another secondary heating element) may then be used to heat the dispensing surface(s) (e.g., oven walls 216, baffle structures 245, and/or other surfaces of the oven 210) to the dispensing temperature such that the atomic objects deposited on the depositing surface(s) (e.g., oven walls 216, baffle structures 245, and/or other surfaces of the oven 210) are dispensed through the dispensing aperture 214.

In various embodiments, the decomposition chemical reaction, atomizing chemical reaction, and/or dispensing of the elemental atomic objects are performed with the oven 210 located within a pressure controlled environment. For example, at least a portion of the dispenser 200 may be disposed within a pressure-controlled environment for during the decomposition chemical reaction, atomizing chemical reaction, and/or dispensing of the elemental atomic objects. For example, the dispenser 200 may comprise a flange 250 configured to couple the dispenser 200 to a pressure controlled chamber such that the oven 210 is disposed within the pressure-controlled chamber. For example, the flange 250 may be configured to couple the dispenser 200 to a vacuum and/or cryostat chamber 40 (see FIG. 4) such that the oven 210 is disposed within the vacuum and/or cryostat chamber. The portion 252 of the dispenser 200 within the pressure controlled chamber may comprise the oven 210, at least a portion of the cooling component 260, and at least a portion of the heating component 270. For example, the portion 252 of the dispenser 200 disposed within the pressure-controlled chamber may be configured such that elemental atomic objects dispensed from the dispenser 200 through the dispensing aperture 214 are dispensed into the pressure-controlled chamber. In various embodiments, the portion 254 of the dispenser 200 disposed outside of the pressure-controlled chamber may comprise couplings and/or connections to a cooling system 70, electric current and/or voltage source, and/or the like. For example, the portion 254 of the dispenser 200 disposed outside of the pressure-controlled chamber may comprise couplings 238 between the cooling component 260 and the cooling system 70 and/or connections between elements of the heating component 270 (e.g., leads attached to ends of the filaments 232, 236 and/or leads 272, 274) to an electric current and/or voltage source.

In various embodiments, the dispenser 200 may comprise various other components not described in detail herein. For example, the dispenser 200 may comprise one or more thermocouples configured to enable monitoring of the temperature within the crucible chamber 240 and/or of the portion of the oven 210 coupled to the cooling component 260. In another example, the dispenser 200 may comprise one or more sensors and/or measuring devices configured to monitor the completeness and/or state of the decomposition chemical reaction, atomizing chemical reaction, and/or dispensing of the elemental atomic objects.

As noted above, FIG. 1 illustrates an example technique of dispensing elemental atomic objects using only a small amount of a composition comprising the atomic objects and for which an atomizing reaction occurs at a temperature that is greater than the dispensing threshold temperature. Beginning with step/operation 102 shown in FIG. 1, at least a portion of a reaction component is coated with a composition comprising the atomic objects. For example, the reaction component may be at least partially submerged in and/or the like an aqueous solution (or other solution) comprising the composition comprising the atomic objects. The composition comprising the atomic objects may then be permitted to dry onto the reaction component. In an example embodiment, the reaction component comprises one or more materials that are participants in the atomizing chemical reaction. In an example embodiment, the reaction component is a filament or wire (e.g., the central portion 234 of the primary filament 232). In an example embodiment, the filament or wire is made of an electrically conductive material that can withstand temperatures at least as high as the atomizing reaction temperature. In an example embodiment, the reaction component comprises tantalum. For example, the reaction component may be a tantalum filament.

At step/operation 104, at least the coated portion of the reaction component is enclosed within an oven of a dispenser. For example, the central portion 234 of the primary filament 232 may be enclosed within the oven 210. In an example embodiment, the dispenser 200 may then be secured to a first pressure-controlled chamber via flange 250. In an example embodiment, the oven 210 may be degassed and/or cleaned out while secured to the first pressure-controlled chamber by operation of the secondary heating element. For example, the secondary heating element may be operated to heat at least a portion of the oven 210 such that any material within the crucible chamber (e.g., other than the composition comprising the atomic objects is dispensed from the crucible chamber through the dispensing aperture 214. In an example embodiment, the degassing and/or cleaning out of the oven 210 may occur during the decomposition chemical reaction.

At step/operation 106, the primary heating element (e.g., primary filament 232) is used to heat the composition comprising the atomic objects to cause a decomposition chemical reaction to proceed. For example, the heating component may heat the composition comprising the atomic objects to a decomposition reaction temperature which may cause the decomposition reaction to occur. A result of the decomposition chemical reaction is a partially decomposed composition comprising the atomic objects. In an example embodiment, the partially decomposed composition is an approximately uniformly distributed film over at least a portion of central portion 234 of the primary filament 232. In an example embodiment, at least a portion of the oven is maintained at and/or around the decomposition reaction temperature (which may be a range of temperatures in an example embodiment) until formation of a byproduct of the decomposition chemical reaction is no longer detected within the oven. For example, a residual gas analyzer (RGA), ion gauge, pressure gauge, and/or the like within the first pressure-controlled chamber may be used to detect when the byproduct (and/or other material) leaving the crucible chamber 240 via the dispensing aperture 214. When the RGA, ion gauge, pressure gauge, and/or the like stops detecting and/or detects a significant decrease in the amount of byproduct and/or other materials being dispensed through the dispensing aperture 214, it may be determined that the decomposition chemical reaction is complete. In various embodiments, a decomposition chemical reaction is not performed as the composition comprising the atomic objects may be decomposed to provide elemental atomic objects in a single atomizing chemical reaction.

In an example embodiment, after completion of the decomposition chemical reaction and/or degassing/cleaning of the oven 210, the dispenser 200 may be decoupled from the first pressure-controlled chamber and coupled to a second pressure-controlled chamber. In an example embodiment, the atomic object confinement apparatus is disposed within the second pressure-controlled chamber. By performing the decomposition chemical reaction and/or degassing/cleaning of the oven 210 in a first pressure-controlled chamber and dispensing the elemental atomic objects into a second pressure-controlled chamber, the second pressure-controlled chamber may be kept cleaner. For example, an experiment and/or the like may be carried out within the second pressure-controlled chamber without interaction or contamination by byproducts of the decomposition chemical reaction and/or other materials dispensed during the degassing/cleaning process. In an example embodiment, the atomizing chemical reaction is completed with the dispenser 200 coupled to the first pressure-controlled chamber and the dispenser 200 is coupled to the second pressure-controlled chamber for the dispensing of the elemental atomic objects.

At step/operation 108, the heating component 270 (e.g., primary filament 232) is used to heat the composition and/or partially decomposed composition comprising the atomic objects to cause an atomizing chemical reaction to proceed. For example, the heating component 270 may heat the composition and/or partially decomposed composition comprising the atomic objects to an atomizing reaction temperature which may cause the atomizing reaction to occur. In an example embodiment, the primary filament 232 may comprise a component that is a participant in the atomizing chemical reaction. For example, the atomizing chemical reaction may be a reduction reaction and the primary filament 232 may comprise a component that acts as the reducing agent in the reduction reaction.

In various embodiments, as the atomizing reaction occurs, a cooling component 260 is used to maintain at least a portion of the oven at a cooled temperature. In an example embodiment, the cooled temperature is in a range of 150-300° C. In an example embodiment, the cooled temperature is approximately 200° C. In various embodiments, the cooled temperature is less than the dispensing threshold temperature. For example, the depositing surface(s) may be maintained at the cooled temperature by the cooling component 260. In various embodiments, as the atomizing chemical reaction occurs, the elemental atomic objects may become disposed adjacent and/or near the cooled portion (e.g., depositing surface(s)) of the oven 210. In an example embodiment, the depositing surfaces (e.g., the cooled portion of the oven 210) comprises the oven walls 216 and the elemental atomic objects may be deposited on the oven walls 216 within the crucible chamber 240.

At step/operation 110, the oven 210 may be allowed to cool. For example, heating component 270 may be turned off or turned down such that the heating component stops generating heat and/or reduces the amount of heat being generated. For example, an electric current and/or voltage applied to the primary filament 232 may be reduced and/or turned off. In various embodiments, the oven 210 may be cooled passively. For example, the oven 210 may be cooled by reducing the amount of heat generated by the heating component and allowing heat to dissipate (e.g., via conduction, convection, and/or radiation) from the oven 210. In an example embodiment, the oven 210 may be actively cooled. For example, the cooling component 260 may be operated to aid in the dissipation of heat from oven 210 (e.g., in addition to passive conduction, convention, and/or radiation cooling). In various embodiments, the oven 210 is cooled until the temperature within the crucible chamber 240 is at or below the dispensing threshold temperature and/or dispensing temperature and/or reaches a cooling temperature that is below the dispensing threshold temperature and/or dispensing temperature.

In an example embodiment, the atomizing chemical reaction is completed through a single round of heating the composition and/or partially decomposed composition comprising the atomic objects. In an example embodiment, the atomizing chemical reaction is completed through a series of heating steps (e.g., until the depositing surfaces reach a cut-off temperature) and cooling steps (e.g., until the depositing surfaces reach a reset temperature). Once the atomizing chemical reaction has been completed and the oven has been cooled, the depositing surface(s) within the crucible chamber has elemental atomic objects deposited thereon. The deposited elemental atomic objects may then be dispensed from the dispenser 200.

At step/operation 112, a heating component (e.g., secondary heating element) may be turned on to heat the oven 210 to the dispensing temperature and the atomic objects are dispensed from the dispenser 200. For example, the heating component may be turned on and the cooling component 260 may be turned off (if an active cooling component is present) such that the dispensing surface(s) of the oven 210 is heated to the dispensing temperature. For example, the secondary filament 236 may be configured to heat the dispensing surface(s) to the dispensing temperature. For example, the oven walls 216 may be heated to cause the dispensing surface(s) to be heated to the dispensing temperature. In an example embodiment, the dispensing temperature is in the range of 300 to 500° C. In various embodiments, heating the dispensing surface(s) to the dispensing temperature causes elemental atomic objects deposited on the dispensing surface(s) to sublimate and be dispensed through the dispensing aperture 214. For example, as the dispensing surface(s) warms to the dispensing temperature, the elemental atomic objects may melt, vaporize, and/or sublimate and move through the crucible chamber 240 toward the dispensing aperture (e.g., in response to vapor pressure and/or the like within the crucible chamber 240). In an example embodiment, the cooling component 260 (if an active cooling component is present) during the cooling of the oven 210, such that the atomic objects are dispensed as the dispensing surface(s) warm (e.g., possibly without further active heating).

Once the elemental atomic objects are dispensed through the dispensing aperture 214, the elemental atomic objects may pass through a load hole and/or the like of an atomic object containment apparatus 300 (see FIG. 4) and be trapped therein. For example, the dispensing aperture 214 may be aligned with the load hole and/or target component of the atomic object containment apparatus. For example, an elemental atomic object may be dispensed through the dispensing aperture 214, travel through a load hole and/or the like of an atomic object containment apparatus and either be trapped (e.g., via one or more electromagnetic fields) as a neutral atom and/or as part of a group of neutral atoms or ionized (e.g., via application of an ionizing laser beam) and trapped as an ion and/or as part of a group of ions. Various actions may be performed on the elemental atomic objects contained within the atomic object containment apparatus, as appropriate for the application.

Technical Advantages

In various scenarios, it may be desired to dispense elemental atomic objects such that the elemental atomic objects may be trapped and/or confined by an atomic object confinement apparatus, such as an ion trap and/or the like. The atomic object confinement apparatus may only be able to trap and/or confine atomic objects provided to the atomic object confinement apparatus at a temperature less than a dispensing threshold temperature. In particular, the temperature of an atomic object is indicative of the kinetic energy of the atomic object and the confinement apparatus may not be capable of trapping and/or confining atomic objects having kinetic energy corresponding to a temperature greater than the dispensing threshold temperature. Moreover, the atomic objects may only be available in small amounts due to various safety and/or cost concerns. For example, the atomic objects may be radioactive and therefore pose a safety concern. Additionally, the atomic objects may not be readily available in elemental form, may readily oxidize, and/or the like. For example, a composition comprising the atomic objects may need to undergo a decomposition chemical reaction and/or an atomizing chemical reaction to generate elemental atomic objects. However, the decomposition and/or atomizing reaction temperatures may be greater than the dispensing threshold temperature of the atomic object confinement apparatus to which the atomic objects are to be dispensed. For example, the atomic objects may be radioactive barium $^{133}$Ba, the atomic object confinement apparatus may be an ion trap (e.g., a surface ion trap) having a dispensing threshold temperature in the range of 300-500° C., and the decomposition and atomizing reaction temperatures may be 650° C. and approximately 1000° C., respectively. Therefore, directly dispensing the atomic objects from the atomizing reaction is not an efficient solution in these scenarios. Moreover, due to the small amount of atomic objects available, traditional atomic object dispensing methods, such as laser ablation, may not be efficient solutions in these scenarios. Thus, in such scenarios, a technical problem exists as to how to dispense such atomic objects.

One example use of atomic objects loaded within an atomic object containment apparatus is as use as qubits of a quantum computer. For example, $^{133}$Ba has a favorable hyperfine structure for state detection and qubit addressability (for qubit operation), and Doppler cooling and state readout transitions corresponding to visible wavelengths. Thus, $^{133}$Ba may be particularly useful as a qubit. However, $^{133}$Ba cannot be used as a qubit of a quantum computer unless the $^{133}$Ba can be efficiently loaded into an ion trap such as a surface ion trap, which tend to have relatively shallow potential wells (e.g., 10-100 meV).

Various embodiments provide methods, apparatus, systems, and/or the like providing technical solutions to this technical problem. For example, various embodiments provide methods, apparatus, systems, and/or the like for dispensing elemental atomic objects in scenarios where the atomic objects are not readily available in elemental form, may readily oxidize, are available in small amounts (e.g., due to safety and/or cost concerns), have a decomposition and/or atomizing chemical reaction that occurs at a reaction temperature that is greater than a dispensing threshold temperature, and/or the like. Moreover, example embodiments provide improvements to the fields of dispensing atomic objects and loading atomic objects into atomic object confinement apparatuses (e.g., such as ion traps and/or the like which may be part of a quantum computer and/or other system).

An additional advantage is provided in the case of $^{133}$Ba as the atomic object when barium nitrate is used as the composition comprising the atomic objects. In particular, when the composition comprising the atomic objects is coated onto the central portion 234 of the primary filament 232 (e.g., by evaporating an aqueous solution comprising the composition comprising the atomic objects), the coating of the composition comprising the atomic objects may be clumpy and not uniformly distributed. However, during the decomposing chemical reaction, the nitrous oxide and molecular oxygen are released and the barium oxide forms a generally uniformly distributed film over at least a portion of the central portion 234 of the primary filament 232. The generally uniformly distributed film of the partially decomposed composition comprising the atomic objects (the barium oxide) results in an efficient completion of the atomizing chemical reaction.

Exemplary Quantum Computer Comprising an Atomic Object Confinement Apparatus

FIG. 4 provides a schematic diagram of an example quantum computer system 400 comprising an atomic object confinement apparatus 300 (e.g., an ion trap and/or the like), in accordance with an example embodiment. In various embodiments, the dispenser 200 may be operated to cause the atomic object confinement apparatus 300 to be loaded with elemental atomic objects. For example, the dispensing aperture 214 of the dispenser 200 may be coupled to a load hole of the atomic object confinement apparatus 300. For example, a controller 30 of the quantum computer system 400 may control operation of the cooling system and one or more voltage sources 50 to cause the operation of the cooling component 260 and the heating component 270 of the dispenser 200 in accordance with an example embodiment, such that the dispenser 200 dispenses elemental atomic objects which are then loaded into and trapped by the atomic object confinement apparatus 300.

In various embodiments, the quantum computer system 400 comprises a computing entity 10 and a quantum computer 410. In various embodiments, the quantum computer 410 comprises a controller 30, a cryostat and/or vacuum chamber 40 enclosing a confinement apparatus 300 (e.g., ion trap 100) and a portion 252 of a dispenser 200, and one or more manipulation sources 60. For example, the cryostat and/or vacuum chamber 40 may be the second pressure-controlled chamber. In an example embodiment, the one or more manipulation sources 60 may comprise one or more lasers (e.g., optical lasers, microwave sources, and/or the like). In various embodiments, the one or more manipulation sources 60 are configured to manipulate and/or cause a controlled quantum state evolution of one or more atomic objects within the confinement apparatus. For example, in an example embodiment, wherein the one or more manipulation sources 60 comprise one or more lasers, the lasers may provide one or more laser beams to the confinement apparatus within the cryostat and/or vacuum chamber 40. In various embodiments, the quantum computer 410 comprises one or more voltage sources 50. For example, the voltage sources 50 may comprise a plurality of voltage drivers and/or voltage sources and/or at least one RF driver and/or voltage source. The voltage sources 50 may be electrically coupled to the corresponding potential generating elements (e.g., electrodes) of the confinement apparatus 300, in an example embodiment.

In various embodiments, a computing entity 10 is configured to allow a user to provide input to the quantum computer 410 (e.g., via a user interface of the computing entity 10) and receive, view, and/or the like output from the quantum computer 410. The computing entity 10 may be in communication with the controller 30 of the quantum computer 410 via one or more wired or wireless networks 20 and/or via direct wired and/or wireless communications. In an example embodiment, the computing entity 10 may translate, configure, format, and/or the like information/data, quantum computing algorithms, and/or the like into a computing language, executable instructions, command sets, and/or the like that the controller 30 can understand and/or implement.

In various embodiments, the controller 30 is configured to control the voltage sources 50, cryostat system and/or vacuum system controlling the temperature and pressure within the cryostat and/or vacuum chamber 40, components of the dispenser 200, manipulation sources 60, and/or other systems controlling various environmental conditions (e.g., temperature, pressure, and/or the like) within the cryostat and/or vacuum chamber 40 and/or configured to manipulate and/or cause a controlled evolution of quantum states of one or more atomic objects within the confinement apparatus. For example, the controller 30 may cause a controlled evolution of quantum states of one or more atomic objects within the confinement apparatus to execute a quantum circuit and/or algorithm. In various embodiments, the atomic objects confined within the confinement apparatus are used as qubits of the quantum computer 410.

Exemplary Controller

In various embodiments, a confinement apparatus 300 is incorporated into a system (e.g., a quantum computer 410) comprising a controller 30. In various embodiments, the controller 30 configured to control various elements of the system (e.g., quantum computer 410). For example, the controller 30 may be configured to control the voltage sources 50, a cryostat system and/or vacuum system controlling the temperature and pressure within the cryostat and/or vacuum chamber 40, manipulation sources 60, cooling system 70, and/or other systems controlling the environmental conditions (e.g., temperature, humidity, pressure, and/or the like) within the cryostat and/or vacuum chamber 40 and/or configured to manipulate and/or cause a controlled evolution of quantum states of one or more atomic objects within the confinement apparatus.

As shown in FIG. 5, in various embodiments, the controller 30 may comprise various controller elements including processing elements 505, memory 510, driver controller elements 515, a communication interface 520, analog-digital converter elements 525, and/or the like. For example, the processing elements 505 may comprise programmable logic devices (CPLDs), microprocessors, coprocessing entities, application-specific instruction-set processors (ASIPs), integrated circuits, application specific integrated circuits (ASICs), field programmable gate arrays (FPGAs), programmable logic arrays (PLAs), hardware accelerators, other processing devices and/or circuitry, and/or the like. and/or controllers. The term circuitry may refer to an entirely hardware embodiment or a combination of hardware and computer program products. In an example embodiment, the processing element 505 of the controller 30 comprises a clock and/or is in communication with a clock.

For example, the memory 510 may comprise non-transitory memory such as volatile and/or non-volatile memory storage such as one or more of as hard disks, ROM, PROM, EPROM, EEPROM, flash memory, MMCs, SD memory cards, Memory Sticks, CBRAM, PRAM, FeRAM, RRAM, SONOS, racetrack memory, RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. In various embodiments, the memory 510 may store qubit records corresponding the qubits of quantum computer (e.g., in a qubit record data store, qubit record database, qubit record table, and/or the like), a calibration table, an executable queue, computer program code (e.g., in a one or more computer languages, specialized controller language(s), and/or the like), and/or the like. In an example embodiment, execution of at least a portion of the computer program code stored in the memory 510 (e.g., by a processing element 505) causes the controller 30 to perform one or more steps, operations, processes, procedures and/or the like described herein for tracking the phase of an atomic object within an atomic system and causing the adjustment of the phase of one or more manipulation sources and/or signal(s) generated thereby.

In various embodiments, the driver controller elements 510 may include one or more drivers and/or controller elements each configured to control one or more drivers. In various embodiments, the driver controller elements 510 may comprise drivers and/or driver controllers. For example, the driver controllers may be configured to cause one or more corresponding drivers to be operated in accordance with executable instructions, commands, and/or the like scheduled and executed by the controller 30 (e.g., by the processing element 505). In various embodiments, the driver controller elements 515 may enable the controller 30 to operate a voltage source 50, manipulation source 60, cooling system 70, and/or the like. In various embodiments, the drivers may be laser drivers; vacuum component drivers; drivers for controlling the flow of current and/or voltage applied to electrodes used for maintaining and/or controlling the trapping potential of the confinement apparatus 300 (and/or other driver for providing driver action sequences to potential generating elements of the confinement apparatus) and/or the flow of current and/or voltage applied to a heating component 270 of a dispenser 200; cryostat and/or vacuum system component drivers; cooling system drivers, and/or the like. In various embodiments, the controller 30 comprises means for communicating and/or receiving signals from one or more optical receiver components such as cameras, MEMs cameras, CCD cameras, photodiodes, photomultiplier tubes, and/or the like. For example, the controller 30 may comprise one or more analog-digital converter elements 525 configured to receive signals from one or more optical receiver components, calibration sensors, and/or the like.

In various embodiments, the controller 30 may comprise a communication interface 520 for interfacing and/or communicating with a computing entity 10. For example, the controller 30 may comprise a communication interface 520 for receiving executable instructions, command sets, and/or the like from the computing entity 10 and providing output received from the quantum computer 410 (e.g., from an optical collection system) and/or the result of a processing the output to the computing entity 10. In various embodiments, the computing entity 10 and the controller 30 may communicate via a direct wired and/or wireless connection and/or one or more wired and/or wireless networks 20.

Exemplary Computing Entity

FIG. 6 provides an illustrative schematic representative of an example computing entity 10 that can be used in conjunction with embodiments of the present invention. In various embodiments, a computing entity 10 is configured to allow a user to provide input to the quantum computer 410 (e.g., via a user interface of the computing entity 10) and receive, display, analyze, and/or the like output from the quantum computer 410.

As shown in FIG. 6, a computing entity 10 can include an antenna 612, a transmitter 604 (e.g., radio), a receiver 606 (e.g., radio), and a processing element 608 that provides signals to and receives signals from the transmitter 604 and receiver 606, respectively. The signals provided to and received from the transmitter 604 and the receiver 606, respectively, may include signaling information/data in accordance with an air interface standard of applicable wireless systems to communicate with various entities, such as a controller 30, other computing entities 10, and/or the like. In this regard, the computing entity 10 may be capable of operating with one or more air interface standards, communication protocols, modulation types, and access types. For example, the computing entity 10 may be configured to receive and/or provide communications using a wired data transmission protocol, such as fiber distributed data interface (FDDI), digital subscriber line (DSL), Ethernet, asynchronous transfer mode (ATM), frame relay, data over cable service interface specification (DOCSIS), or any other wired transmission protocol. Similarly, the computing entity 10 may be configured to communicate via wireless external communication networks using any of a variety of protocols, such as general packet radio service (GPRS), Universal Mobile Telecommunications System (UMTS), Code Division Multiple Access 2000 (CDMA2000), CDMA2000 1× (1×RTT), Wideband Code Division Multiple Access (WCDMA), Global System for Mobile Communications (GSM), Enhanced Data rates for GSM Evolution (EDGE), Time Division-Synchronous Code Division Multiple Access (TD-SCDMA), Long Term Evolution (LTE), Evolved Universal Terrestrial Radio Access Network (E-UTRAN), Evolution-Data Optimized (EVDO), High Speed Packet Access (HSPA), High-Speed Downlink Packet Access (HSDPA), IEEE 802.11 (Wi-Fi), Wi-Fi Direct, 802.16 (WiMAX), ultra wideband (UWB), infrared (IR) protocols, near field communication (NFC) protocols, Wibree, Bluetooth protocols, wireless universal serial bus (USB) protocols, and/or any other wireless protocol. The computing entity 10 may use such protocols and standards to communicate using Border Gateway Protocol (BGP), Dynamic Host Configuration Protocol (DHCP), Domain Name System (DNS), File Transfer Protocol (FTP), Hypertext Transfer Protocol (HTTP), HTTP over TLS/SSL/Secure, Internet Message Access Protocol (IMAP), Network Time Protocol (NTP), Simple Mail Transfer Protocol (SMTP), Telnet, Transport Layer Security (TLS), Secure Sockets Layer (SSL), Internet Protocol (IP), Transmission Control Protocol (TCP), User Datagram Protocol (UDP), Datagram Congestion Control Protocol (DCCP), Stream Control Transmission Protocol (SCTP), HyperText Markup Language (HTML), and/or the like.

Via these communication standards and protocols, the computing entity 10 can communicate with various other entities using concepts such as Unstructured Supplementary Service information/data (USSD), Short Message Service (SMS), Multimedia Messaging Service (MMS), Dual-Tone Multi-Frequency Signaling (DTMF), and/or Subscriber Identity Module Dialer (SIM dialer). The computing entity 10 can also download changes, add-ons, and updates, for instance, to its firmware, software (e.g., including executable instructions, applications, program modules), and operating system.

The computing entity 10 may also comprise a user interface device comprising one or more user input/output interfaces (e.g., a display 616 and/or speaker/speaker driver coupled to a processing element 608 and a touch screen, keyboard, mouse, and/or microphone coupled to a processing element 608). For instance, the user output interface may be configured to provide an application, browser, user interface, interface, dashboard, screen, webpage, page, and/or similar words used herein interchangeably executing on and/or accessible via the computing entity 10 to cause display or audible presentation of information/data and for interaction therewith via one or more user input interfaces. The user input interface can comprise any of a number of devices allowing the computing entity 10 to receive data, such as a keypad 618 (hard or soft), a touch display, voice/speech or motion interfaces, scanners, readers, or other input device. In embodiments including a keypad 618, the keypad 618 can include (or cause display of) the conventional numeric (0-9) and related keys (#, *), and other keys used for operating the computing entity 10 and may include a full set of alphabetic keys or set of keys that may be activated to provide a full set of alphanumeric keys. In addition to providing input, the user input interface can be used, for example, to activate or deactivate certain functions, such as screen savers and/or sleep modes. Through such inputs the computing entity 10 can collect information/data, user interaction/input, and/or the like.

The computing entity 10 can also include volatile storage or memory 622 and/or non-volatile storage or memory 624, which can be embedded and/or may be removable. For instance, the non-volatile memory may be ROM, PROM, EPROM, EEPROM, flash memory, MMCs, SD memory cards, Memory Sticks, CBRAM, PRAM, FeRAM, RRAM, SONOS, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. The volatile and non-volatile storage or memory can store databases, database instances, database management system entities, data, applications, programs, program modules, scripts, source code, object code, byte code, compiled code, interpreted code, machine code, executable instructions, and/or the like to implement the functions of the computing entity 10.

CONCLUSION

Many modifications and other embodiments of the invention set forth herein will come to mind to one skilled in the art to which the invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method for dispensing atomic objects, the method comprising:
    sealing a reaction component at least partially coated with a composition comprising the atomic objects inside an oven with the oven disposed within a pressure-controlled chamber;
    with the oven disposed within the pressure-controlled chamber, heating the composition comprising the atomic objects to an atomizing reaction temperature to cause an atomizing chemical reaction to occur, wherein (a) the reaction component comprises a material that is a participant in the atomizing chemical reaction, (b) a result of the atomizing chemical reaction is elemental atomic objects deposited on a depositing surface within the oven, and (c) the atomizing reaction temperature is greater than a dispensing threshold temperature;
    allowing the oven to cool to below the dispensing threshold temperature; and
    heating the oven to a dispensing temperature to cause the elemental atomic objects to be dispensed from the oven through a dispensing aperture, wherein the dispensing temperature is less than or equal to the dispensing threshold temperature.

2. The method of claim 1, wherein the atomizing chemical reaction is a reduction reaction and the material is a reducing agent in the atomizing chemical reaction.

3. The method of claim 1, further comprising, before the causing of the atomizing chemical reaction, heating the oven to a decomposition reaction temperature to cause a decomposition chemical reaction to occur, wherein the atomizing chemical reaction is performed using at least a portion of the molecules generated by the decomposition chemical reaction.

4. The method of claim 3, wherein the dispenser is coupled to a first pressure-controlled chamber during the decomposition chemical reaction and coupled to a second pressure-controlled chamber during the dispensing of the atomic objects.

5. The method of claim 1, wherein the atomic objects are barium (Ba) atoms, the material is tantalum (Ta), the atomizing reaction temperature is at least 900° C., and the dispensing threshold temperature is in a range of 300-500° C.

6. The method of claim 1, wherein the temperature of the depositing surface is controlled by at least one of (a) an active cooling component, (b) a passive cooling component, or (c) a series of heating cooling steps performed during the atomizing chemical reaction.

7. The method of claim 1, wherein the atomic objects are radioactive.

8. The method of claim 1, further comprising trapping dispensed elemental atomic objects using an atomic object confinement apparatus.

9. The method of claim 8, wherein the atomic object confinement apparatus is a component of a quantum computer.

10. The method of claim 1, wherein the reaction component comprises a filament and heating the composition comprising the atomic objects is performed by supplying an electric current to the filament.

11. A dispenser for dispensing atomic objects, the dispenser comprising:
    an oven, the oven comprising oven walls defining a tube, a base cap closing off one end of the tube, and an aperture cap at least partially closing off an opposite end of the tube, the oven walls, base cap, and aperture cap defining a crucible chamber of the oven, the oven further comprising a depositing surface located within the crucible chamber; and
    a heating component configured to heat a composition comprising the atomic objects within the oven,
    wherein:
        a temperature of the depositing surface is controlled when the heating component heats the composition comprising the atomic objects to an atomizing reaction temperature to cause an atomizing chemical reaction to occur, wherein (a) a result of the atomizing chemical reaction is elemental atomic objects deposited on the depositing surface, and (b) the atomizing reaction temperature is greater than a dispensing threshold temperature, and
        the heating component is configured to allow the oven to cool after the atomizing chemical reaction is performed and then heat the oven to a dispensing temperature to cause the elemental atomic objects to be dispensed from the oven through a dispensing aperture in the aperture cap, wherein the dispensing temperature is less than or equal to the dispensing threshold temperature.

12. The dispenser of claim 11, wherein the heating component comprises at least one filament, a portion of the filament is at least partially coated with the composition comprising the atomic objects, the portion of the filament is disposed within the oven, and a component of the filament is a participant in the atomizing chemical reaction.

13. The dispenser of claim 12, wherein the atomizing chemical reaction is a reduction reaction and the component of the filament is a reducing agent in the atomizing chemical reaction.

14. The dispenser of claim 12, wherein the atomic objects are barium (Ba) atoms, the filament comprises tantalum (Ta), and the atomizing reaction temperature is at least 900° C.

15. The dispenser of claim 11, further comprising a cooling component configured to cool the depositing surface.

16. The dispenser of claim 15, wherein the cooling component comprises an externally cooled thermally conductive tube in thermal contact with an exterior surface of the oven walls.

17. The dispenser of claim 16, further comprising a flange configured to couple a portion of the dispenser comprising the oven within a pressure-controlled chamber, wherein a portion of the thermally conductive tube disposed opposite the flange from the oven is water cooled.

18. The dispenser of claim 15, wherein the cooling component is a passive cooling component.

19. The apparatus of claim 11, wherein the dispensing threshold temperature is in a range of 300-500° C.

20. A method for dispensing atomic objects, the method comprising:
 sealing a reaction component at least partially coated with a composition comprising the atomic objects inside an oven with the oven disposed within a pressure-controlled chamber;
 with the oven disposed within the pressure-controlled chamber, heating the composition comprising the atomic objects to an atomizing reaction temperature to cause an atomizing chemical reaction to occur, wherein (a) the reaction component comprises a material that is a participant in the atomizing chemical reaction, (b) a result of the atomizing chemical reaction is elemental atomic objects deposited on a depositing surface within the oven, and (c) the atomizing reaction temperature is greater than a dispensing threshold temperature; and
 cooling the oven to at least the dispensing threshold temperature.

\* \* \* \* \*

UNITED STATES PATENT AND TRADEMARK OFFICE
CERTIFICATE OF CORRECTION

PATENT NO. : 12,002,597 B2  
APPLICATION NO. : 17/444220  
DATED : June 4, 2024  
INVENTOR(S) : Mark Kokish et al.

Page 1 of 1

It is certified that error appears in the above-identified patent and that said Letters Patent is hereby corrected as shown below:

In the Claims

In Column 25, Line 17, Claim 19, delete "apparatus" and insert -- dispenser --, therefor.

Signed and Sealed this  
Fifth Day of August, 2025

Coke Morgan Stewart  
*Acting Director of the United States Patent and Trademark Office*